United States Patent
Pittaluga et al.

(10) Patent No.: US 6,586,936 B2
(45) Date of Patent: Jul. 1, 2003

(54) PROCESS FOR MANUFACTURING MAGNETIC FIELD GENERATING DEVICES IN NUCLEAR MAGNETIC RESONANCE IMAGING APPARATUSES AND IMAGE GENERATING DEVICE ACCORDING TO SAID PROCESS

(75) Inventors: Stefano Pittaluga, Genoa (IT); Alessandro Trequattrini, Genoa (IT); Davide Carlini, Genoa (IT)

(73) Assignee: Esaote, S.p.A., Casale Monferrato (IT)

( * ) Notice: Subject to any disclaimer, the term of this patent is extended or adjusted under 35 U.S.C. 154(b) by 0 days.

(21) Appl. No.: 09/880,902

(22) Filed: Jun. 15, 2001

(65) Prior Publication Data

US 2002/0019132 A1 Feb. 14, 2002

(30) Foreign Application Priority Data

Jun. 15, 2000 (IT) ................. SV2000A000023

(51) Int. Cl.[7] .................................................. G01V 3/00
(52) U.S. Cl. ........................................ 324/319; 335/229
(58) Field of Search ................................ 324/319, 320, 324/318, 300, 306, 307, 321, 322; 335/229, 301, 304

(56) References Cited

U.S. PATENT DOCUMENTS

| 4,818,966 A | 4/1989 | Miyamoto et al. |
| 4,827,235 A | 5/1989 | Inomata et al. |
| 4,870,380 A | 9/1989 | McGinley |
| 5,124,651 A | 6/1992 | Danby et al. |
| 5,194,810 A | 3/1993 | Breneman et al. |
| 5,243,286 A | 9/1993 | Rzedzian et al. |
| 5,414,399 A | 5/1995 | Breneman et al. |
| 5,555,251 A | 9/1996 | Kinanen |
| 5,592,089 A | * 1/1997 | Danby et al. ............ 324/318 |
| 6,150,818 A | * 11/2000 | Barber ................. 324/319 |

FOREIGN PATENT DOCUMENTS

| DE | 198 54 483 | 6/2000 |
| EP | 0 479 514 | 4/1992 |
| EP | 0 957 369 | 11/1999 |
| JP | 1-104252 | 4/1989 |
| JP | 2-087505 | 3/1990 |
| JP | 2-184002 | 7/1990 |

* cited by examiner

*Primary Examiner*—Louis Arana
(74) *Attorney, Agent, or Firm*—Burns, Doane, Swecker & Mathis, L.L.P.

(57) ABSTRACT

The invention relates to a process for manufacturing magnetic field generating devices in Nuclear Magnetic Resonance imaging apparatuses and to an image generating device according to said method. According to the invention, at least one layer of each pole piece is composed a plurality of adjacent or overlapping sheets, electrically insulated from each other. These sheets or foils may have slots, notches or apertures which cause bridges of a material having a lower electric conductivity to be formed between the areas separated by the notches and/or apertures. The bridges of material may be removed after sheet assembly by a cutting operation, particularly by laser cutting.

27 Claims, 6 Drawing Sheets

PROCESS FOR MANUFACTURING MAGNETIC FIELD GENERATING DEVICES IN NUCLEAR MAGNETIC RESONANCE IMAGING APPARATUSES AND IMAGE GENERATING DEVICE ACCORDING TO SAID PROCESS

This application claims priority under 35 U.S.C. §§119 and/or 365 to SV2000A000023 filed in Italy on Jun. 15, 2000; the entire content of which is hereby incorporated by reference.

The invention relates to a process for manufacturing magnetic field generating devices in Nuclear Magnetic Resonance imaging apparatuses wherein the magnetic field is generated in a cavity or gap delimited by two pole pieces and wherein at least one pole piece includes a magnetized element, particularly a permanent magnet element and a ferromagnetic element, which is at least partly divided into individual modular elements arranged side-by-side in a predetermined order.

Several different processes and associated magnetic pole pieces as described above are currently known.

In accordance with a prior art process, the magnetic pole piece/s consist of a base element made of a solid and continuous material whereon an additional ferromagnetic layer is laid as a cover, which is formed by a plurality of blocks, each being in turn formed by a plurality of glued ferromagnetic sheets.

The purpose of this construction is to suppress or at least drastically reduce the formation of eddy currents induced in the ferromagnetic pole piece, which adversely affect the desired characteristics of the resulting magnetic field, and especially the magnetic field generated by gradient coils.

While the present laminate block construction at least partly solves the problem of suppressing currents in the ferromagnetic mass of the pole pieces, it heavily affects fabrication times and costs.

The invention has the object of providing a magnetic field generating process and device as described hereinbefore being simpler, faster and more cost-effective and allowing to obtain at least an equal effectiveness, or even an improved functionality in the suppression of eddy currents induced in the pole piece.

In accordance with a first process step, the invention proposes that each magnetic pole piece has an innermost layer of solid ferromagnetic material, i.e. made of one piece, and a layer composed of a plurality of adjacent or overlapping sheets, electrically insulated from each other.

The process also proposes that these sheets are mechanically pressed against and/or over each other.

As an additional improvement, the process proposes to provide mechanical means for engaging each sheet with the layer of solid ferromagnetic material.

A further step consists in forming a plurality of transverse notches or transverse apertures in the sheets in a comb-like arrangement, which are disposed at predetermined distances from each other and have a predetermined width, and extend from one face to the other of each sheet while, with reference to the sheet dimension parallel to the extension of the notch and/or aperture, said notches and/or apertures extend for a smaller length than the corresponding sheet dimension or in such a manner as to form thin bridges of material, for connecting the sheet areas which are separated by the notches and/or apertures.

The notches or apertures of the sheets may be coincident or non-coincident.

The notches may be all provided on the same edge of the sheet or be alternated on opposite edges.

Notches with different extensions may be alternated in any order.

Apertures, which may be provided alternatively to or in combination with notches may extend all at the same level and/or have all the same extension, or may be staggered in any predetermined order and/or have different extensions.

A further process step consists in assembling the layer of the pole piece which is composed of the sheets with notches and/or apertures and, after mechanically pressing the sheets to the end assembly condition, in eventually cutting the bridges of material which connect the sheet areas separated by the notches.

This cutting operation may be performed by any means. Particularly, this final cut may be performed by mechanical means and/or a laser beam.

According with a further variant embodiment, the process provides that the laminate layer of each pole piece is made of several metal foils laying over a one-piece or solid ferromagnetic plate and over each other, each foil being divided into a plurality of areas of predetermined shapes and sizes, by the provision of discontinuous notches interleaved with bridges of material for connecting the different areas delimited by the notches.

The notches are arranged in at least two transverse directions, whereas the bridges of material for connecting the areas separated by the notches are provided at least or only at the crossing points between the notches.

The individual ferromagnetic foils or sheets may have coincident notches or two sheets with coincident notches may have one or more interposed sheets whose notches are staggered with respect to those of the two sheets with coincident notches and/or to each other, thereby obtaining a pack of sheets with coincident notches alternated with one or more sheets with notches being staggered with respect to the former and or to each other.

A preferred embodiment provides a first set of sheets with coincident notches alternated with a second set of sheets having the same notch pattern as the first set with notches being coincident within the set and staggered by half the distance with respect to the adjacent notches of the first set.

Hence, the bridges of material provided at the crossing points between transverse notches overlap a median portion of the areas delimited by the notches of the underlying and/or overlying sheet.

The invention further provides bridges of material also at the peripheral edges of the sheets.

In the same manner as described above in relation to the first embodiment, the separation of the areas separated by notches may be completed by also cutting the bridges of material.

The bridges of material may be removed by mechanical punching and/or laser cutting. In this case, with reference to the preferred embodiment, the sheet areas separated by notches will have a central bore at the point overlapping the bridge of material of the underlying and/or overlying sheet.

Thanks to the above process, a magnetic pole piece with a modular and/or laminate structure may be fabricated in a simple, fast and cost-effective manner.

The notches or apertures limit the amount of material between the individual sheet areas, thereby drastically increasing the electrical resistance to the currents induced in the pole piece. When this conductivity limitation is insufficient, the final cut during assembly allows an easy and fast separation of the sheet areas separated by notches and/or apertures, thereby completely cutting off any electric contact between the individual sheet areas.

By performing the final cut when the modular part of the magnetic pole piece is in a substantially assembled condition greatly simplifies and speeds up the pole piece assembly operations, thereby reducing manufacturing costs.

A further improvement consists in selecting the orientation of notches or separation surfaces between sheets and/or areas of each sheet.

The currents induced in the pole piece appear to be closely related to the structure of gradient coils. In these conditions, advantages resulted from providing separation surfaces or notches between sheets and/or areas of each sheet oriented transverse to the conductors of the gradient coils.

Particularly, when the conductor/s only have one direction, the separation surfaces between sheets and/or the separation notches between the areas of each sheet are preferably oriented perpendicularly to the axis of the conductors, whereas when two conductors of the gradient coil cross each other or are angularly connected to each other, the separation surfaces and/or the notches should be oriented obliquely and as far as possible at the same distance from the two coil conductors.

The invention also relates to a magnetic field generating device fabricated in accordance with one or more of the process characteristics disclosed above.

Further improvements of the invention will form the subject of the subclaims.

The characteristics of the invention and the advantages derived therefrom will appear more clearly from the following description of a non limiting embodiment, illustrated in the annexed drawings, in which.

Figure 1:
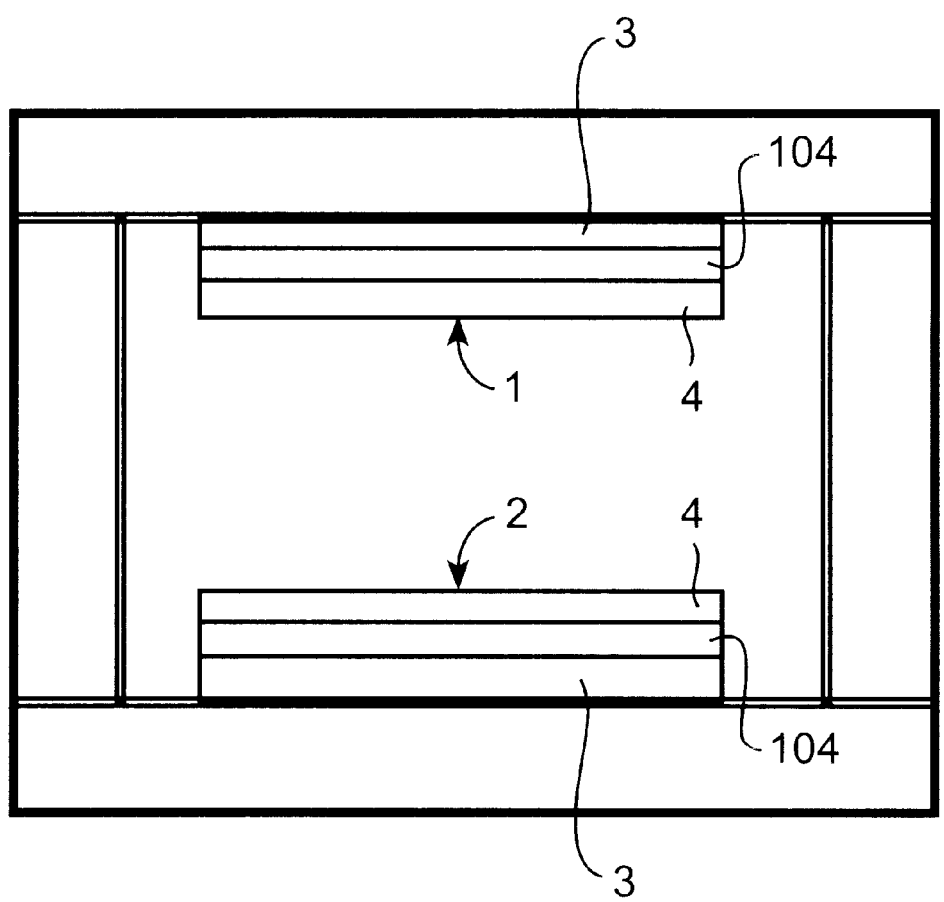
FIG. 1 is a schematic view of the structure of a magnetic field generating device in a Nuclear Magnetic Resonance imaging apparatus.

With reference to FIG. 1, a device for generating magnetic fields, particularly in Nuclear Magnetic Resonance imaging apparatuses has two opposite pole pieces 1 and 2. The two pole pieces are each formed by an element 3 made of a permanently magnetized material or by magnetic field generating coils in combination with elements 4 made of a ferromagnetic material. The two pole pieces are located at a distance from each other, whereby they form a cavity or gap crossed by the magnetic field. A magnetic yoke element closes the magnetic circuit and supports the two magnetic pole pieces 1 and 2.

Figure 2:
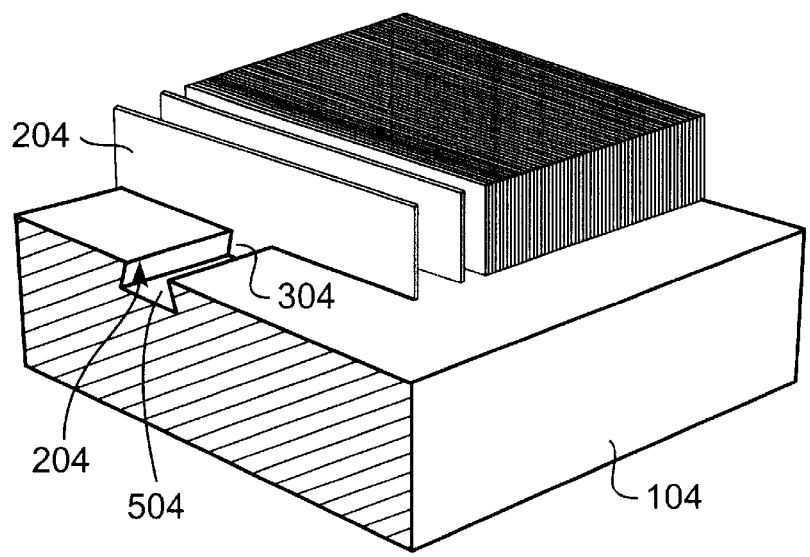
FIG. 2 is a perspective cutaway view of a pole piece of a device according to a first embodiment of the invention.
Figure 3:
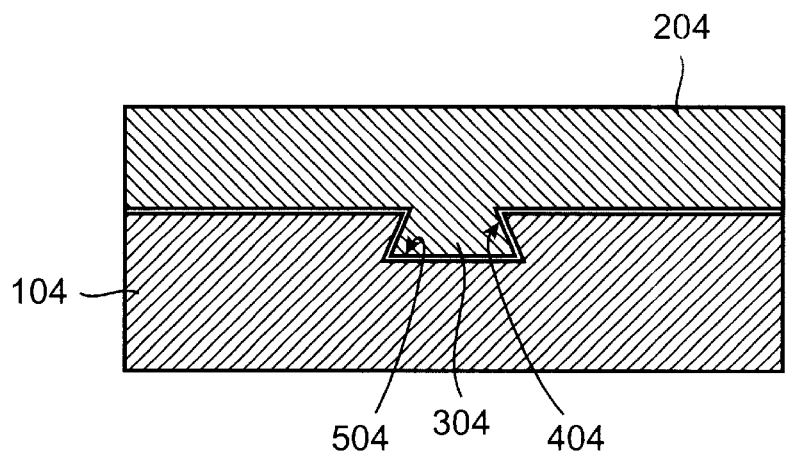
FIG. 3 is a transverse sectional view of the device of FIG. 2 with respect to a plane parallel to the sheets.
Figure 4:
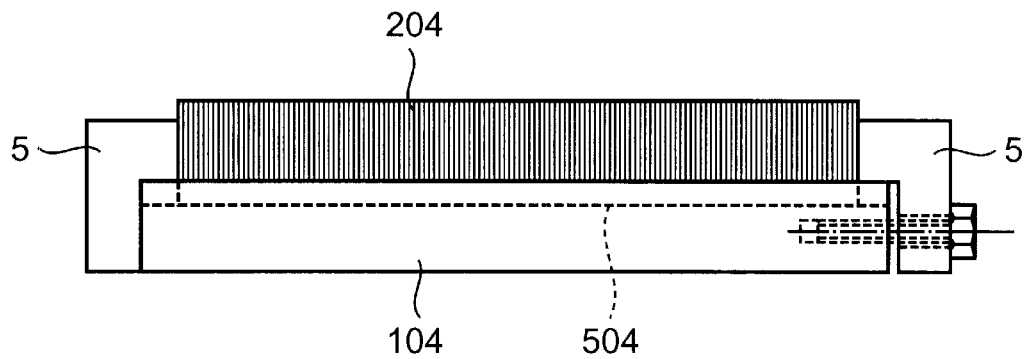
FIG. 4 is a transverse sectional view of the device of the previous figures with respect to a plane perpendicular to that of FIG. 3.

Referring now to FIGS. 2 to 4, each ferromagnetic element is made of a base element, having the form of a monolithic piece of a suitable metal, for instance a plate or the like and of an outer layer, with reference to the cavity defined by the ferromagnetic elements 4. The outer layer consists of a plurality of sheets 204 which are oriented perpendicularly to the cavity-delimiting surface and/or to the surface of the monolithic base element 104 which in this case is, without limitation, a plate and has a surface substantially parallel to the cavity-delimiting one.

The sheets 204 are made of a ferromagnetic material and coated with an electrically insulating layer, for instance varnish, or the like.

For the sake of simplicity, in the embodiment as shown in the figures, the monolithic layer 104 has a rectangular shape and the sheets extend transversely to one of the sides thereof. This shall be intended without limitation, as it is apparent that the same construction of the laminate layer may apply to pole pieces of any shape and size.

The sheets 204 are disposed side-by-side and then pressed against each other by means of pressing side walls 5 which are parallel to the sheets 204 and are fastened to the monolithic element 104 by means of screws or bolts engaged in corresponding threaded holes at the end sides of the monolithic element 104. Advantageously, the pressing walls 5 have a step-like widened upper portion, which lays over the side of the monolithic element 104 whereon the sheets 204 are disposed. The step is selected of such a size that the two pressing walls 5 may exert the predetermined compressive action on the sheets 204 while perfectly adhering against the side edge of the monolithic element 104.

According to a further improvement, each sheet may have an extension 304 at the edge whereby it comes in contact with the monolithic element 104, which has undercuts 404, e.g. has a dovetail or trapezoid shape, all the extensions 304 being designed to be engaged in a complementary groove 304 formed in the contact surface of the monolithic element. This engagement groove is open at least on one end side of the monolithic element to allow insertion of the extensions 304 therein. Therefore, the sheets 204 are pressed against each other by transversely sliding them along said engagement groove 504. This construction has the advantage that the sheets may be mounted on the monolithic element when the device is in a substantially assembled condition. In fact, in this case the sheets 204 are always linked to the monolithic element 104, regardless of the orientation of the surface thereof over which said sheets are designed to rest.

The construction according to FIGS. 2 and 3 provides that the mass of ferromagnetic material is electrically separated in a single direction. A separation transverse to the axial extension of the sheets 204 may be provided as well, by providing sheets 204 whose length is lower than the corresponding dimension of the monolithic base element 104 and more adjacent rows of adjacent sheets. In this case, the monolithic element 104 will have several grooves 504 for engaging the extensions 304 of the sheets 204. The sheets 204 may have different length extensions within the same row or among different rows or may have different lengths. If different lengths are provided within a single row, the transverse separation lines between the rows of sheets will not be orthogonal to the longitudinal extension of the sheets 204 and several different types of lines will be provided, even substantially curved or broken lines, i.e. zigzag or wavy lines.

Figure 5A:
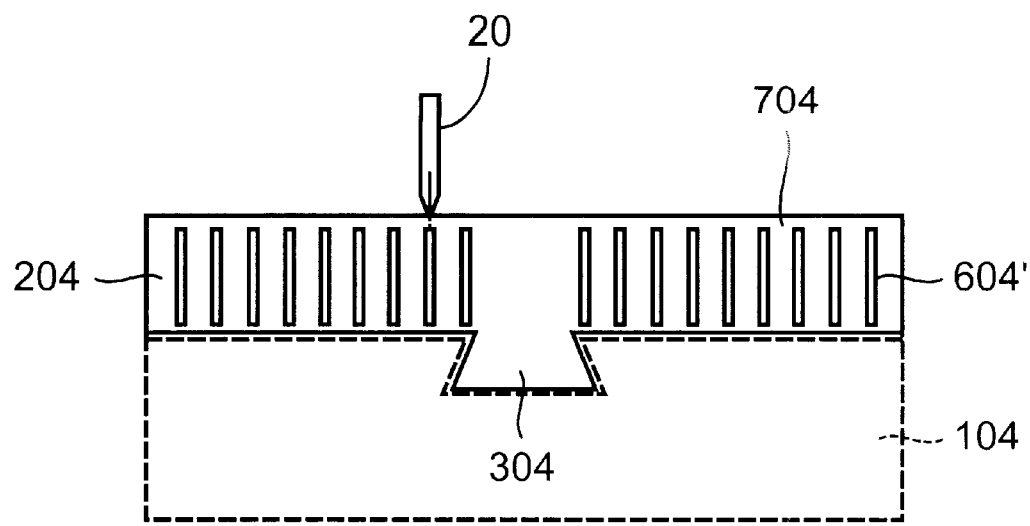
FIGS. 5A and 5B show a sheet according to two variant embodiments of the device of FIGS. 2 to 4.
Figure 5B:
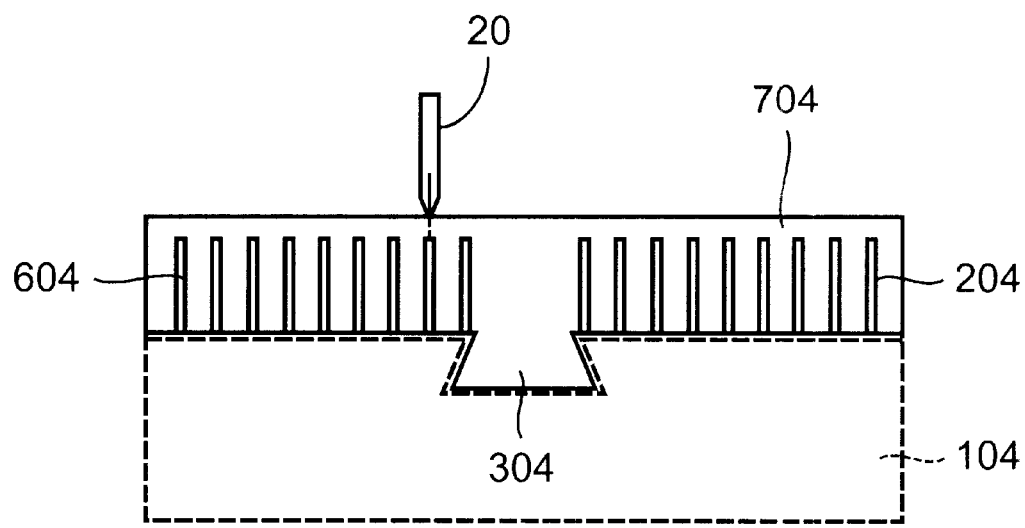

In accordance with the variant embodiments of FIGS. 5A and 5B, the transverse separation may also not be complete, but partial with respect to the overall height of the sheets 204.

In this case, the sheets 204 may have a comb-like profile (FIG. 5B) or have slot-like apertures (FIG. 5A).

The recesses, slots or notches 604 as shown in FIG. 5B have such a depth as to leave, preferably at the exposed surface of the row of adjacent sheets, a bridge of material 704 for connecting the areas of the sheets 204 comprised between the notches 604.

The depth of the notches 604, passing from one side to the other of the sheets may be calibrated in such a manner that the electric resistance between the individual areas of the sheets 204 defined by the notches 604 is relatively high and ensures an effective limitation of the currents induced in the ferromagnetic element formed by the sheets.

This arrangement also applies to the example of FIG. 5A, in which the sheets have transverse slots 604' formed therein.

With particular reference to the embodiment as shown in FIG. 5B, although reference may be extended to FIG. 5A as well, the areas of the sheets 204 which are delimited by the notches 604 or by the slots 604' may be completely separated once the sheets have been mounted on the monolithic base element 104 by cutting off the material bridges 704 both by mechanical means and particularly by laser tools as schematically denoted by numeral 20.

Thanks to the arrangement of FIGS. 5A and 5B, sheets may be assembled in a very simple and fast manner, while obtaining a modular construction of the outer layer of the electrically insulated ferromagnetic portion for suppressing the currents induced in the pole pieces in two different directions.

Cutting by laser tools 20 is known per se and has the advantage that highly accurate and thin cutting lines may be obtained. The notches 604 or the slots 604' may be also formed by using laser tools.

The notches or slots may be provided in a coincident position between different sheets or staggered in such a manner as to be disposed over an imaginary line which is inclined with respect to the sheet extension, or over a curved line or over a broken line, e.g. a zigzag or wavy line, or over any imaginary line whatever.

The cutting depth over the height of the sheet and/or the length and/or the position of the slots with respect to the height extension of the sheet may vary within the set of notches of a single sheet or from one sheet to the other.

With reference to FIGS. 6 to 11, the illustrated variant embodiment provides an outer ferromagnetic laminate layer, which is formed by sheets or foils 204' substantially parallel to the contact surface of the monolithic element 104.

Figures 10, 11:
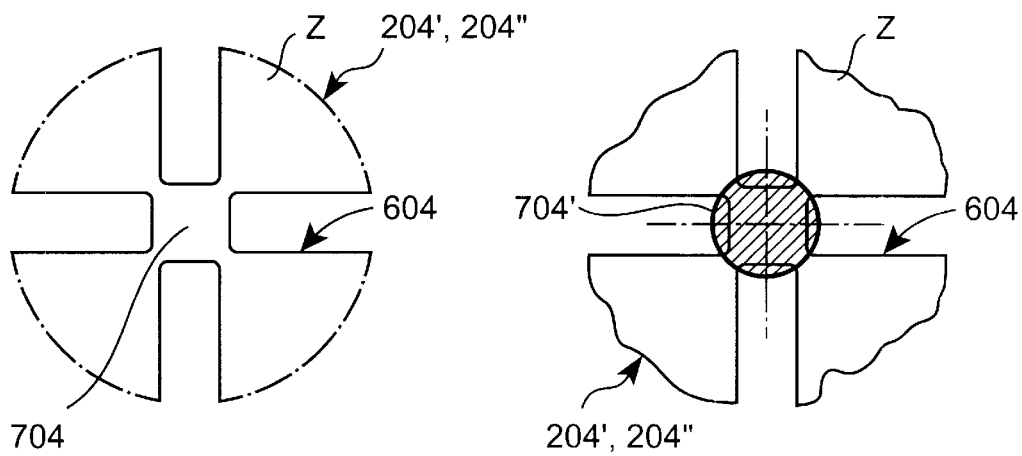
FIG. 10 shows an enlarged detail of the bridge of material connecting the sheet areas separated by notches.
FIG. 11 shows an enlarged detail like that of FIG. 10 in which 704' denotes the point in which the punching means effect the separation.

Here, each sheet is divided into individual areas Z by notches 604 and/or slot-like apertures 604' which extend in transverse, particularly orthogonal directions, whereas at the crossing points between the notches and/or apertures, there are provided bridges of material 704, which interrupt these notches and/or apertures and connect the areas Z of the sheets 204' to each other (see FIG. 10). Bridges of material for connecting adjacent areas Z of the sheets 204' may be also provided at the peripheral edges of the sheets 204'.

By overlapping the sheets 204', it is possible to obtain a laminate construction of the pole piece element 4 laying over the monolithic layer 104, which has transverse notches and/or apertures for separating individual adjacent packs of sheet areas Z, mechanically connected by means of bridges 704, the latter forming low-conductivity passages to reduce the currents induced in the ferromagnetic mass.

Figure 9:
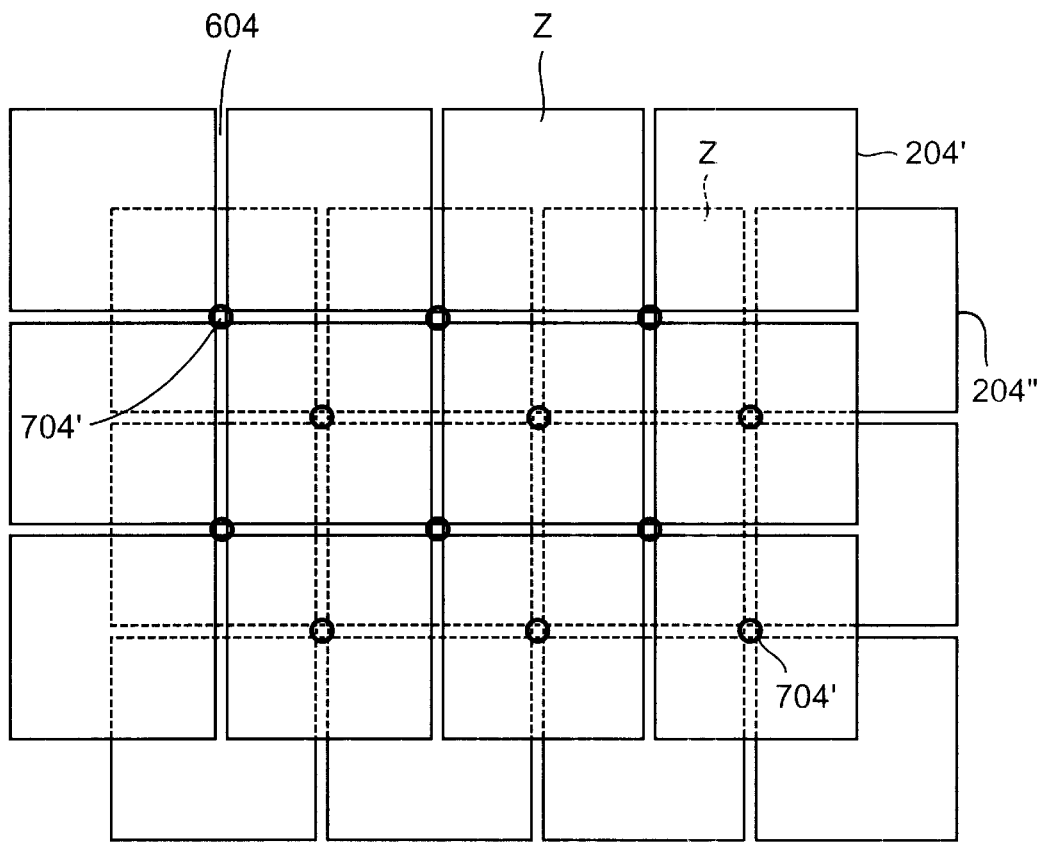
FIG. 9 shows the arrangement of two overlapping sheets with staggered notches in the two directions of the plane subtended by the sheets.

In accordance with an improvement like the one described with reference to the above embodiment, the packs of sheet areas Z may be completely separated by removing the bridges of material, e.g. by mechanical punching and/or by laser beam cutting, as denoted by numeral 704' in FIG. 9 and in FIG. 11.

Figure 6:
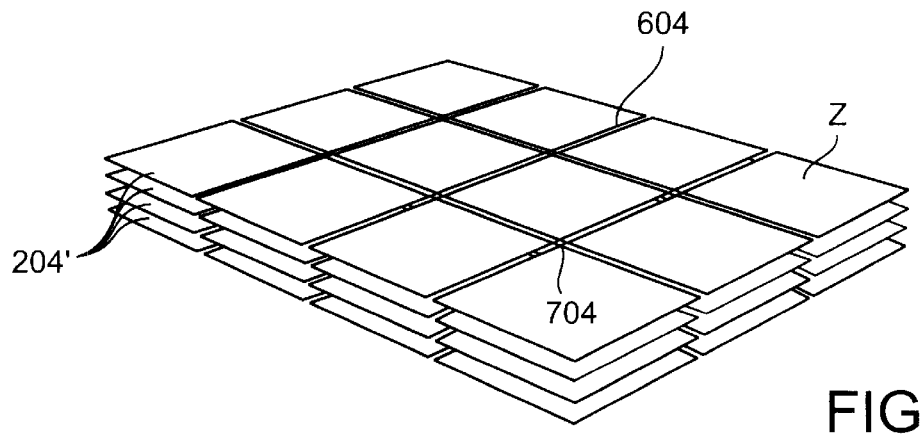
FIG. 6 is a transverse sectional view of a device according to a second embodiment of the invention.
Figure 7:
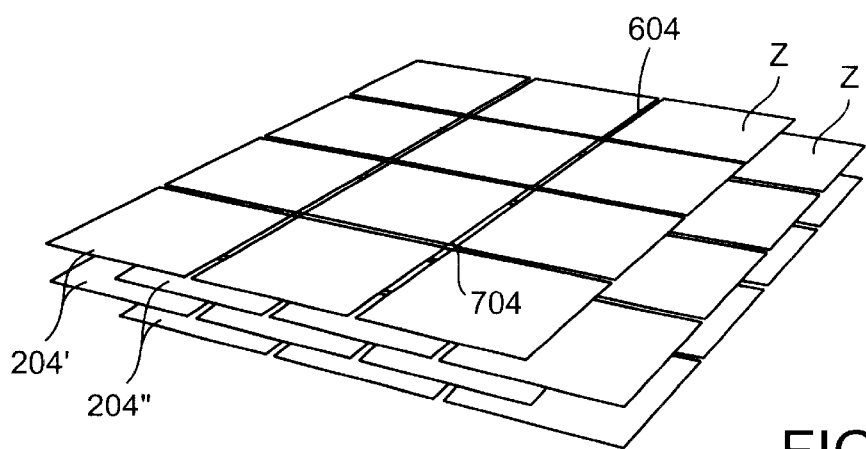
FIG. 7 shows a first variant of the device of FIG. 6.
Figure 8:
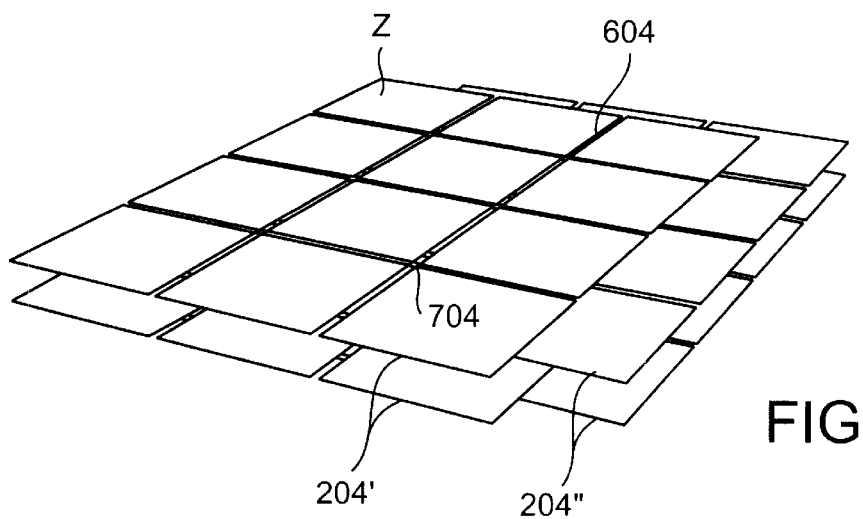
FIG. 8 shows a second variant of the device of FIG. 6.

FIGS. 6 to 8 introduce several different examples of sheet arrangement. In FIG. 6, the notches and/or slots 604 and the bridges of material 704 are coincident between sheets 204'.

A first variant provides, as shown in FIG. 7, that the notches and/or slots 604, hence the bridges are staggered substantially by half the distance between two adjacent notches or slots 604 in one of the two directions subtending the plane which contains the sheets.

Particularly, but not necessarily, said staggering direction is parallel to one of the two directions in which the notches or slots 604 are oriented and perpendicular to the other direction of the notches or slots which cross the former.

A further variant, as shown in FIG. 8, provides at least two different types of sheets having sets of notches and/or apertures which are respectively staggered by half the distance, the former being parallel and oriented in a first direction whereas the latter set of notches and/or apertures are parallel and oriented in a direction transverse to the former. In this case, the two different sheets 204' and 204" overlap in an alternate arrangement, so that the notches and/or apertures of a sheet are in an intermediate position between the parallel and adjacent notches and/or apertures of the directly overlying and/or underlying sheet, and this for both types of notches and/or slots oriented in the two perpendicular directions. Conversely, the bridges of material 704 at crossover points overlap a median point of the areas Z of the directly overlying and/or underlying sheet.

Different staggering extents and/or more different sheets may be also provided, e.g. three or more sheets differing in the position of the notches and/or apertures with reference to the first sheet, and whose staggering distance is respectively a multiple of a minimum staggering distance of the notches and/or apertures of directly overlapping sheets.

Obviously, an exact relation substantially exists between the number of sheets 204' and the minimum staggering distance provided between the notches and/or apertures of two directly adjacent sheets.

Moreover, the staggering distance may be divided in a non-linear manner between the different sheets 204' in accordance with different mathematical rules.

It is also possible to alternate one or more identical sheets, i.e. having coincident notches and/or apertures, with one or more sheets being different from the former and identical to each other as regards the position of the notches and/or apertures.

Any combination of the above arrangements of sheets and notches are possible in principle.

According to the above, with reference to the condition of sheets having coincident notches and/or apertures and bridges of material, even in this case the individual sheet areas Z may be completely separated from each other by removing the bridges of material by mechanical punching and/or laser beam cutting. However, in this example, punching will be also provided at intermediate points in the sheet areas Z overlapped by the bridges of material of the sheets having notches and/or apertures in different positions.

This arrangement provides, like the former, an easier assembly of the laminate or modular layer of the pole pieces, as the sheet areas are connected to each other, though weakly, separation therebetween being provided after the sheets are stacked on the monolithic element.

The sheets may be mechanically clamped together or glued by interposing therebetween insulating layers having additional gluing properties, such as varnishes, lacquers or the like, widely used in the art, e.g. for insulating coil conductors.

For the sake of simplicity, the above illustrated and disclosed embodiments are limited to rectangular or square shapes both of the pole pieces and of their sheets. However, the inventive principle also applies to pole pieces or sheets having different shapes, i.e. circular, polygonal, regular or irregular shapes.

It is further possible to provide a combination of sheets according to the first embodiment as shown in FIGS. 2 to 5 and sheets according to the embodiment as shown in FIGS. 6 to 11.

Figure 12:
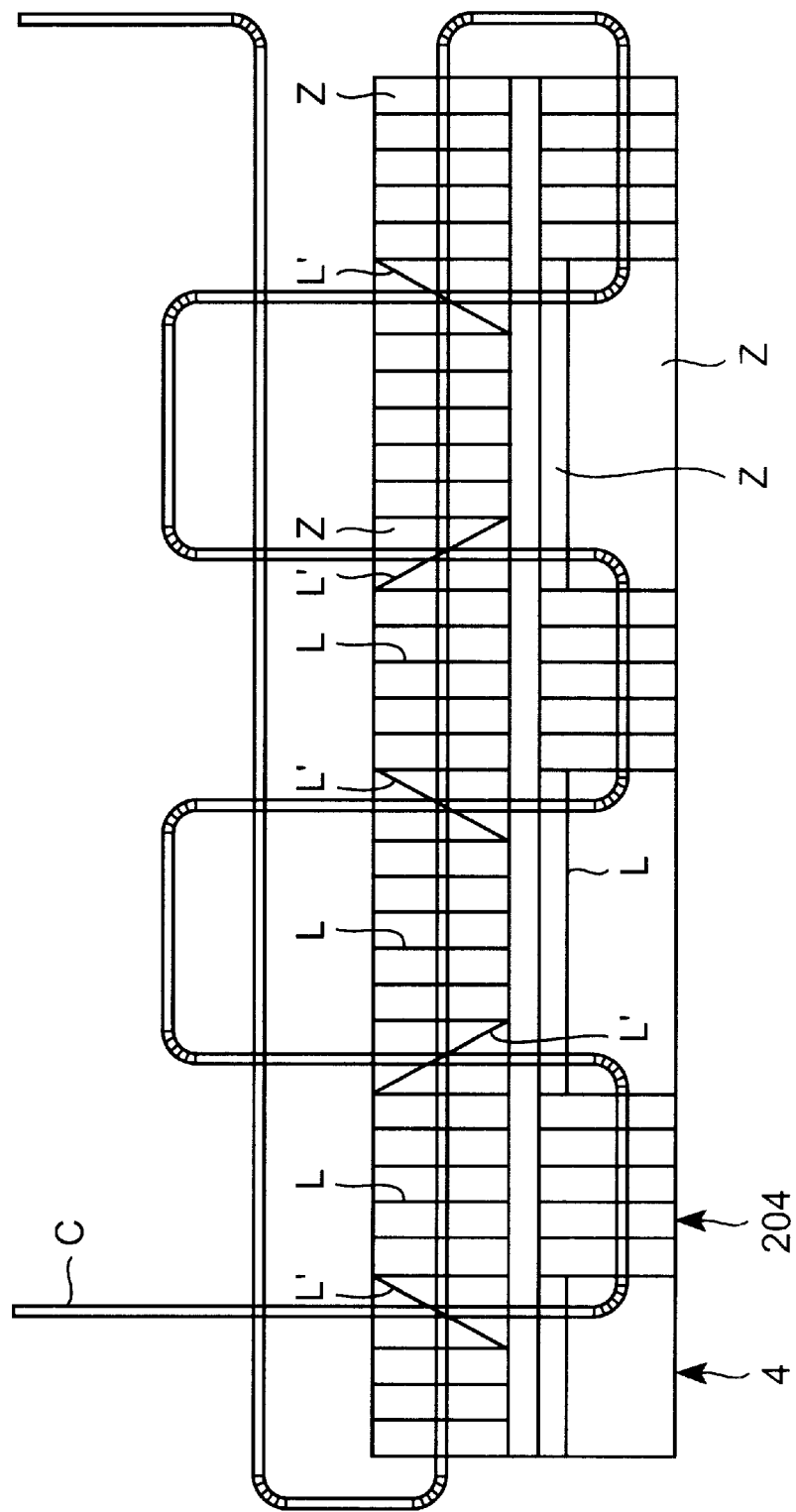
FIG. 12 is a schematic view of the pattern of the notches separating the different areas of a sheet or of blocks of overlapping sheets as related to the orientation of the conductors of a gradient coil.

FIG. 12 shows an additional improvement regarding the pattern of separation lines between the areas of the sheets 204' or 204".

In fact, in Nuclear Magnetic Resonance imaging machines, current induction in the ferromagnetic masses of the pole pieces appeared to be primarily caused by the gradient coil. With reference to this situation, advantages were obtained in suppressing said currents induced in the pole pieces, by providing separation lines L between sheet areas or packs of overlapped sheet areas and/or between sheets, and by orienting said separation surfaces L perpendicular to the conductors C of the gradient coil. However, at the crossing points of the conductors C of one or more different gradient coils, the separation surfaces L' shall have an inclined orientation with respect to said conductors C, in such a manner as to be substantially, as far as possible at the same distance from said crossed conductors C.

This arrangement is schematically shown in FIG. 12, in which L, L' denote the separation lines between the different sheet areas or packs of sheet areas and C denotes the conductor of a gradient coil.

The arrangement as shown in FIG. 12 allows to optimize the suppression of currents induced in the ferromagnetic material, and to further reduce the adverse effect thereof on the operation of the device.

The arrangement as shown in FIG. 12 may be provided in combination with the above disclosure, with reference to the described and illustrated embodiments. The invention is not limited to what has been described and illustrated herein, but may be widely varied, especially as regards construction, without departure from the guiding principle disclosed above and claimed below.

What is claimed is:

1. A process for manufacturing a magnetic field generating device in a Nuclear Magnetic Resonance imaging apparatus, wherein a magnetic field is generated in a cavity or gap delimited by two magnetic pole pieces of the magnetic field generating device and wherein at least one of the magnetic pole pieces has an innermost layer of solid ferromagnetic material, and a layer composed of a plurality of adjacent or overlapping sheets of ferromagnetic material, wherein each of the plurality of sheets includes a plurality of areas, the plurality of areas on each sheet being at least partially separated from each other by a plurality of recesses, slots, or notches formed in the plurality of sheets so as to provide an electric resistance between adjacent ones of the areas so as to limit currents induced in the plurality of sheets from passing between adjacent ones of the areas, wherein each of the areas on each of the plurality of sheets are held together by a portion of the ferromagnetic material, the process comprising:

arranging the plurality of sheets on the innermost layer of solid ferromagnetic material;

mechanically pressing the plurality of sheets against each other; and securing the plurality of sheets to the innermost layer of solid ferromagnetic material.

2. The process as claimed in claim 1, wherein each of the plurality of sheets is arranged such that a principal plane of each of the plurality of sheets is perpendicular to a principal plane of the innermost layer of solid ferromagnetic material.

3. The process as claimed in claim 2, wherein each of the plurality of sheets includes an extension and the innermost layer of solid ferromagnetic material includes an engagement groove, and the securing step includes arranging the extensions of the plurality of sheets in the engaging groove.

4. The process as claimed in claim 1, wherein each of the recesses, slots, or notches formed in the plurality of sheets is a slot extending all the way through the respective sheet, and the portions of the ferromagnetic material form material bridges connecting each of the adjacent ones of the areas, and after the securing step, the material bridges are removed from the plurality of sheets.

5. The process as claimed in claim 4, wherein each of the plurality of sheets is arranged such that a principal plane of each of the plurality of sheets is parallel to a principal plane of the innermost layer of solid ferromagnetic material, and when the material bridges are removed, a portion of material from an adjacent sheet is also removed.

6. The process as claimed in claim 2, wherein each of the recesses, slots, or notches formed in the plurality of sheets is a slot extending all the way through the respective sheet, and the portions of the ferromagnetic material form material bridges connecting each of the adjacent ones of the areas, and the material bridges are arranged at one edge of the plurality of sheets to form a comb structure, and after the securing step, the material bridges are removed from the plurality of sheets.

7. The process as claimed in claim 6, wherein each of the plurality of sheets includes an extension and the innermost layer of solid ferromagnetic material includes an engagement groove, and the securing step includes arranging the extensions of the plurality of sheets in the engaging groove.

8. The process as claimed in claim 1, wherein the innermost layer of solid ferromagnetic material is made of one piece.

9. The process as claimed in claim 1, wherein the recesses, slots, or notches formed in the plurality of sheets are parallel slots extending all the way through the respective sheet, and the portions of the ferromagnetic material form material bridges connecting each of the adjacent ones of the areas, and after the securing step, the material bridges are removed from the plurality of sheets.

10. The process as claimed in claim 1, wherein the portions of the ferromagnetic material form material bridges connecting each of the adjacent ones of the areas, and after the securing step, the material bridges are removed from the plurality of sheets.

11. The process as claimed in claim 1, wherein the portions of the ferromagnetic material form material bridges connecting each of the adjacent ones of the areas, and after the securing step, the material bridges are removed from the plurality of sheets with a laser.

12. The process as claimed in claim 1, wherein the portions of the ferromagnetic material form material bridges connecting each of the adjacent ones of the areas, and after the securing step, the material bridges are removed from the plurality of sheets with a mechanical device.

13. The process as claimed in claim 1, wherein each of the plurality of sheets is arranged such that a principal plane of the plurality of sheets is parallel to a principal plane of the innermost layer of solid ferromagnetic material.

14. The process as claimed in claim 13, wherein the plurality of sheets are arranged in an offset manner such that the plurality of areas on one of the sheets is offset with respect to the plurality of areas on an adjacent one of the sheets.

15. A magnetic field generating device in a Nuclear Magnetic Resonance imaging apparatus, comprising:

two magnetic pole pieces for generating a magnetic field in a cavity or gap delimited by the two magnetic pole pieces;

wherein at least one of the magnetic pole pieces has an innermost layer of solid ferromagnetic material made of one piece, and a layer composed of a plurality of adjacent or overlapping sheets of ferromagnetic material, wherein each of the plurality of sheets includes a plurality of areas, the plurality of areas on each sheet being at least partially separated from each other by a plurality of recesses, slots, or notches formed in the plurality of sheets so as to provide an electric resistance between adjacent ones of the areas so as to limit currents induced in the plurality of sheets from passing between adjacent ones of the areas, wherein each of the areas on each of the plurality of sheets are held together by a portion of the ferromagnetic material.

16. The device as claimed in claim 15, wherein each of the plurality of sheets is arranged such that a principal plane of the plurality of sheets is perpendicular to a principal plane of the innermost layer of solid ferromagnetic material.

17. The device as claimed in claim 16, wherein each of the plurality of sheets includes an extension and the innermost layer of solid ferromagnetic material includes an engagement groove, and the extensions of the plurality of sheets are secured in the engaging groove.

18. The device as claimed in claim 15, wherein each of the recesses, slots, or notches formed in the plurality of sheets is a slot extending all the way through the respective sheet, and the portions of the ferromagnetic material form material bridges connecting each of the adjacent ones of the areas.

19. The device as claimed in claim 15, wherein each of the plurality of sheets is arranged such that a principal plane of the plurality of sheets is parallel to a principal plane of the innermost layer of solid ferromagnetic material.

20. A device as claimed in claim 15, further comprising one or more gradient coils for generating magnetic field gradients, and that the recesses, slots, or notches have an orientation transverse to an orientation of a conductor of the gradient coil or coils.

21. A device as claimed in claim 20, wherein when the conductor of the one or more gradient coils only has one direction, the recesses, slots, or notches are oriented perpendicularly to an axis of the conductor.

22. A device as claimed in claim 20, wherein there are a plurality of conductors for the one or more gradient coils and axes of the conductors cross each other or are angularly connected to each other, the recesses, slots, or notches are oriented obliquely to the conductors.

23. A magnetic field generating device in a Nuclear Magnetic Resonance imaging apparatus, comprising:

two magnetic pole pieces for generating a magnetic field in a cavity or gap delimited by the two magnetic pole pieces;

wherein at least one of the magnetic pole pieces has an innermost layer of solid ferromagnetic material made of one piece, and a layer composed of a plurality of adjacent or overlapping sheets of ferromagnetic material, wherein each of the plurality of sheets includes a plurality of areas, the plurality of areas on each sheet being separated from each other by a plurality of recesses, slots, or notches formed in the plurality of sheets so as to provide an electric resistance between adjacent ones of the areas so as to limit currents induced in the plurality of sheets from passing between adjacent ones of the areas;

wherein each of the plurality of sheets is arranged such that a principal plane of the plurality of sheets is perpendicular to a principal plane of the innermost layer of solid ferromagnetic material.

24. The device as claimed in claim 23, wherein each of the plurality of sheets includes an extension and the innermost layer of solid ferromagnetic material includes an engagement groove, and the extensions of the plurality of sheets are secured in the engaging groove.

25. A device as claimed in claim 23, further comprising one or more gradient coils for generating magnetic field gradients, and that the recesses, slots, or notches have an orientation transverse to an orientation of a conductor of the gradient coil or coils.

26. A device as claimed in claim 25, wherein when the conductor of the one or more gradient coils only has one direction, the recesses, slots, or notches are oriented perpendicularly to an axis of the conductor.

27. A device as claimed in claim 25, wherein there are a plurality of conductors for the one or more gradient coils and axes of the conductors cross each other or are angularly connected to each other, the recesses, slots, or notches are oriented obliquely to the conductors.

* * * * *